Dec. 20, 1966 J. R. BIARD ET AL 3,293,513

SEMICONDUCTOR RADIANT DIODE

Filed Aug. 8, 1962 3 Sheets-Sheet 1

JAMES R. BIARD
GARY E. PITTMAN
INVENTORS
BY James O. Dixon
ATTORNEY

SEMICONDUCTOR RADIANT DIODE

Filed Aug. 8, 1962 3 Sheets-Sheet 2

JAMES R. BIARD
GARY E. PITTMAN
INVENTORS

BY James O. Dixon
ATTORNEY

JAMES R. BIARD
GARY E. PITTMAN
INVENTORS
BY James O. Dixon
ATTORNEY

United States Patent Office 3,293,513
Patented Dec. 20, 1966

3,293,513
SEMICONDUCTOR RADIANT DIODE

James R. Biard and Gary E. Pittman, Richardson, Tex., assignors to Texas Instruments Incorporated, Dallas, Tex., a corporation of Delaware Filed Aug. 8, 1962, Ser. No. 215,642
9 Claims. (Cl. 317—237)

The present invention relates to a gallium-arsenide radiant diode. More specifically, it relates to a gallium-arsenide diode that radiates electromagnetic energy having a band of wavelengths in the near infrared spectrum when the junction of the diode is forward-biased, and has application to any system that requires a light source of these frequency characteristics.

It is readily apparent that miniature light sources have utility in a wide variety of electronic systems provided there is available a suitable detector responsive to the frequency or frequencies of the light source. Miniature light sources are even more attractive from an electronic engineer's standpoint if they are solid state in nature, viz., are fabricated according to the general techniques of making transistors, solid state diodes, and the like. This is obvious because of the size and cost reduction attendant to solid state transistor technology. Moreover, it is highly desirable that it be possible to fabricate an entire electronic system using solid state technology such as that used in the transistor art. The present invention described below is an advance in this art in that it makes available a highly efficient electronic optical component whose output is optical in nature, yet whose physical construction is made possible by solid state technology, thus increasing the variety of phenomena available for use in miniature solid state electronic systems.

It is therefore an object of this invention to provide a gallium-arsenide semiconductor light source of high efficiency the fabrication of which is compatible with the techniques of the solid state semiconductor art.

Another object is to provide a gallium-arsenide diode that radiates electromagnetic energy in the near infrared spectrum when the junction of the diode is forward-biased.

Yet another object is to provide a gallium-arsenide radiant diode whose design is such as to yield high efficiency in terms of the number of photons radiated from the diode versus the magnitude of bias current flowing through the junction of the diode that stimulates the optical output.

Other objects, advantages and features will become apparent from the following description when taken in connection with the appended claims and the attached drawing wherein like reference numerals refer to like parts throughout the several figures, and in which:

This invention provides a gallium-arsenide radiant diode that radiates energy having a band of frequencies in the near infrared spectrum. The diode comprises a body of gallium-arsenide containing a p-n junction that must be forward-biased for efficient production of radiation. This bias produces internally what is known as Lossev emission, which is essentially radiative recombinations of injected carriers of opposite sign, namely recombinations between holes and electrons. Although the Lossev effect is well known to occur in the vicinity of forward-biased rectifying junctions of diodes made of most semiconductor materials, it is equally well accepted that only some of these materials are capable of producing radiation of usable intensity. Moreover, the band of frequencies of light produced by the various semiconductor materials differ with the material used. Although some work has been done in gallium-arsenide, it was not known to the inventors prior to the present invention that a high intensity radiative diode could be produced from gallium-arsenide. This was partly due to the lack of understanding of the physical phenomena associated with the Lossev effect in semiconductor materials and especially in gallium-arsenide, and the optimum physical structure most amenable to producing an efficient radiative diode. This invention provides a diode structure that will efficiently radiate, and thus is useful for applications where a high intensity near infrared light source is required. In addition, this radiative diode is capable of being turned on and off in the order of about $10^{-8}$ sec., and therefore can be used as a light source that can be modulated in the 100 mc. frequency range.

It is thought that the light produced by the Lossev effect near a forward-biased rectifying junction in gallium-arsenide is created primarily in the n-type material adjacent the junction; namely, the greater percentage of the photons are created by hole injection into the material and a subsequent recombination with an electron. In addition, there is evidence that the light created is more readily absorbed in the p-type material than in the n-type material and, in most instances, it will be more advantageous to extract the light through the n-type material rather than through the p-type material. Other considerations as to the physical construction of the diode will be described in detail below with reference to the specific examples given.

Figures 1, 2:
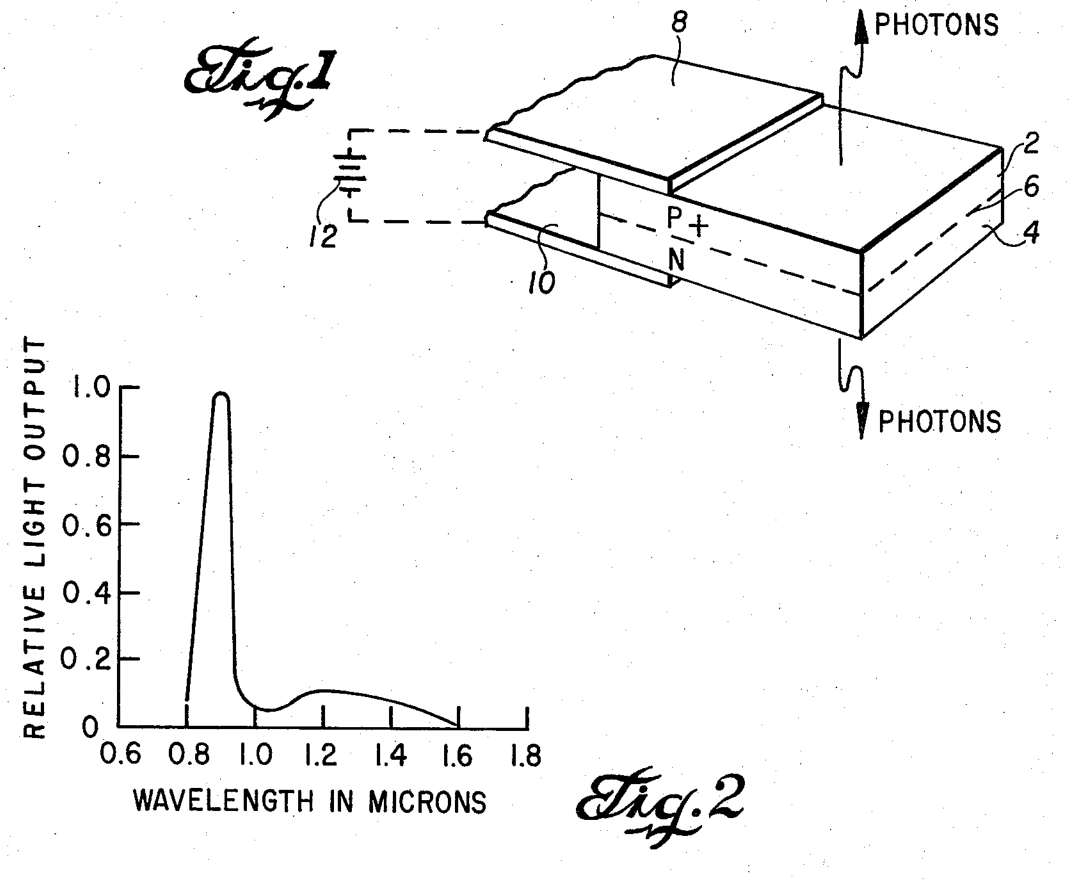
FIG. 1 is a pictorial view of a diode only for the purpose of illustrating the principles of the invention.
FIG. 2 illustrates in graphical form the spectrum of the electromagnetic radiation emitted by the diode.

For illustrative purposes only, reference is had to FIG. 1 which shows a body of gallium-arsenide comprised of an n-type conductivity region 4 and a heavily doped p-type conductivity region 2 forming a rectifying junction 6 with the n-type layer. The p-type region is characterized by a very high acceptor concentration, and because of this fact, it is normally designated as a p+ region. Suitable electrical contacts 8 and 10 are provided to the p+ and n regions, respectively. These connections are non-rectifying in character and are provided for applying a forward current bias through the rectifying junction. For example, a bias source 12 of polarity as shown is applied to the contacts 8 and 10 to forward-bias the junction. Thus holes are injected from the p+ region across the junction into the n-type material, and electrons from the n-type region are injected across the junction and into the p+ region. The greater percentage of the total number of recombinations of carriers of the opposite sign seems to occur in the n-type material in the vicinity of the rectifying junction because of the high efficiency of hole injection into the n-type material that results from the heavy concentration of acceptors in the p-type material. These recombinations are characterized by the emission of light photons of wavelengths in the near infra-red region. Some of the light generated is absorbed in the material and some emerges from the faces of the gallium-arsenide body, as indicated by the arrows. A factor of importance is the relative absorption characteristics of the p and n-type materials, and it is believed that p-type conductivity gallium-arsenide is more absorbing than is the n-type material. Under most circumstances, therefore, more light will be emitted from the surface of the n-type region for any given thickness than that emitted from the surface of the p-type region of an equal thickness.

Suitable measurement techniques and apparatus have been used to measure the magnitude and spectrum of the Lossev emission from the gallium-arsenide body. For example, a Perkin-Elmer Spectrophotometer type 13–U was used to measure these two quantities, and FIG. 2 is a graph of the relative light output plotted along the ordinate, versus the wavelength in microns, plotted along the abscissa. Although this curve is to be considered as only approximate, there is indicated two peaks of light output, one occurring at about the 0.89 micron wavelength and the other occurring at about the 1.25 micron wavelength, the former being over four times greater in magnitude than that of the latter. It is believed that the 0.89 micron wavelength peak is due to recombinations of carriers from the conduction and valence bands of the gallium-arsenide materials, whereas the tails or peaks into the longer wavelength regions are due to recombination from intermediate levels in the forbidden band.

Figure 3:
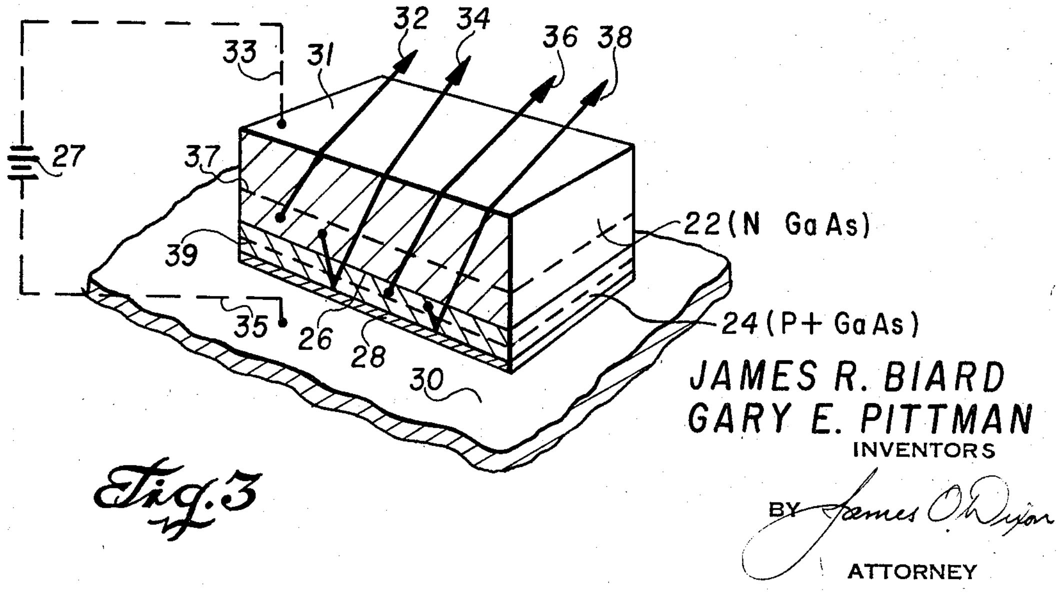
FIG. 3 is an illustrative sectional view of one embodiment of the diode.
Figures 4, 7:
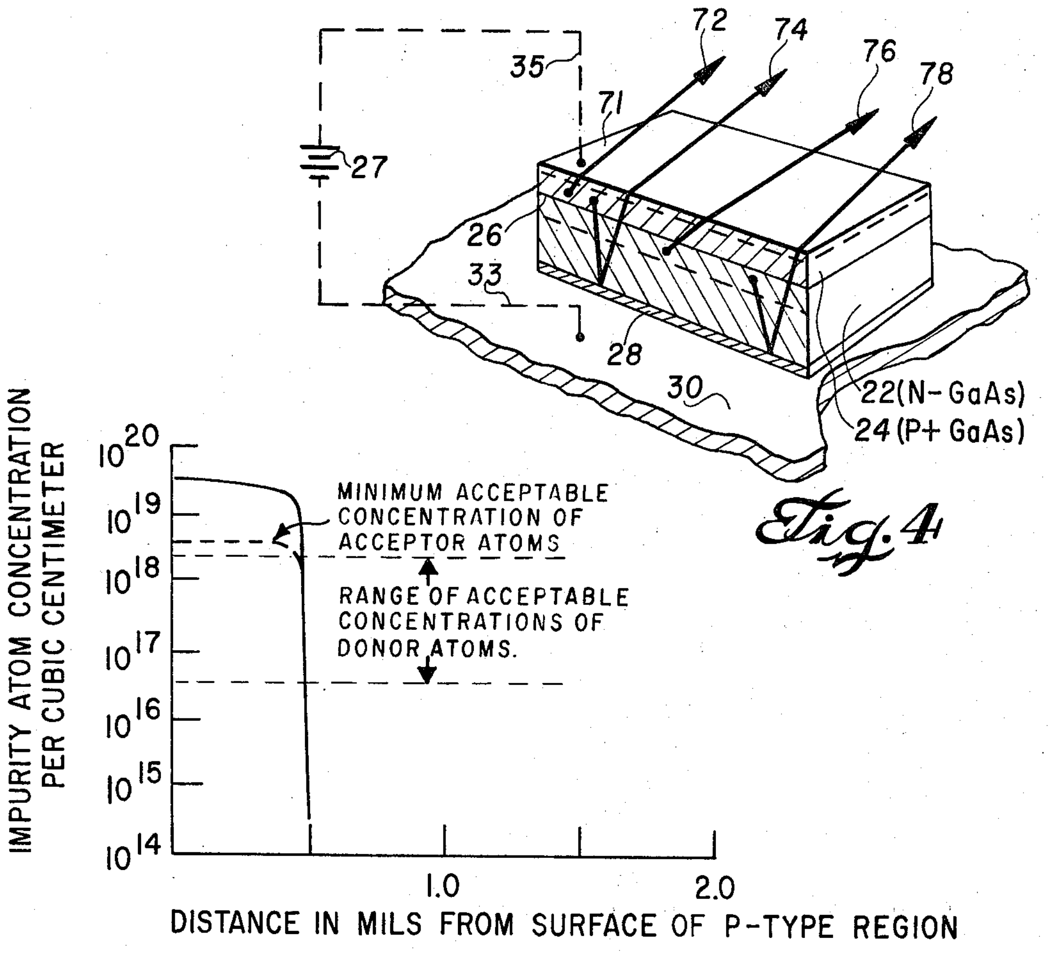
FIG. 4 is an illustrative sectional view of another embodiment of the diode.
FIG. 7 is an illustration in graphical form of the acceptable ranges of the donor and acceptor impurity concentrations in the gallium-arsenide radiant diode of the invention.

To illustrate a radiant diode and the various routes by which light internally generated adjacent the junction can traverse in emerging from a face of the crystal, reference is had to FIGS. 3 and 4, the former being a sectional view of a greatly enlarged diode crystal with the diode mounted at the surface of the p-type region on a suitable conducting platform by means of a highly reflecting solder or alloy, and the latter mounted at the surface of the n-type material on a similar platform. In particular, FIG. 3 shows, for illustrative purposes only, a gallium-arsenide diode comprising a thin p-type region 24 forming a rectifying junction 26 with and being contiguous to a relatively thicker n-type region 22. The diode is mounted at the surface of the p-type region on a suitable conducting platform 30 so as to form a non-rectifying connection by means of a highly reflecting solder or alloy 28. Ohmic electrical contacts 33 and 35, of which a more detailed description is hereinafter given, are provided to the surface 31 of the n-type region 22 and the conductor 30, respectively, so that a forward current bias source 27 can be applied to the junction. For present purposes it is assumed that the connection 33 is large enough in area to ensure a uniform current density throughout the area of the junction, and yet small enough in area with respect to the total area of the surface 31 to have a negligible obstructing effect on any light tending to emerge from the surface.

Four illustrative rays of light are shown emerging from the surface of the n-type region, and each is derived from the generation of light from recombinations as previously described. Each ray is shown to be generated by a recombination process in close proximity to the junction 26 and within a region bounded at its extremity from the junction by the dotted line 37 in the n-type region and the dotted line 39 in the p-type material. The respective regions bounded by the dotted lines 37–39 are assumed to be that in which light can be generated by the recombination process described. Light generated in the n-type material and within the above-stated boundaries can proceed along two distinct paths and still emerge from the surface 31 of the n-type regions. One path is designated by ray 32 proceeding in the direction of the surface at one angle and emerging at a different angle due to refraction caused by the differences in the indices of refraction of the gallium-arsenide material and the media adjacent the surface 31. The other path is designated by ray 34 proceeding across the junction and through the p-type region where it is reflected from the surface of the contact 28 and directed upwards in the direction of the surface 31. Similar considerations are true for light generated in the p-type material between the junction and the boundary 39. Notice should be taken of the fact that some of the light striking the surface 31 in the attempt to emerge from the crystal will be internally reflected if the angle of incidence is greater than a minimum, depending upon the relative indices of refraction of the two medias adjacent this surface, wherein the indices of refraction vary for different wavelengths of light. Moreover, some of the light striking the contact 28 will be absorbed, although it is assumed that this contact is an efficient reflector.

As previously observed it is desirable that light traverse as short a path as possible through the p-type region between its origin and its point of leaving the crystal because of the high absorption rate of the p-type material. Thus the reason is apparent for the thin p-type region as shown in FIG. 3. Assuming for the moment that statistically half of the light generated adjacent the junction on either side proceeds in the direction of the n-type surface 31 and the other half proceeds in the direction of the p-type surface contact 28, the former half of the light travels only a short distance if any, in the p-type material. On the other hand each photon of light of the latter half traverses a distance of approximately twice the thickness of the p-type region. Light emerging from any other surface of the crystal contributes to an efficiency loss, and thus has not been considered in the illustration of FIG. 3.

A similar illustration is shown in FIG. 4 where the same crystal is mounted on the conductor 30 at the surface of the n-type region by means of a highly reflective solder or alloy 28. Rays 72 and 74 are illustrative of two distinct paths in which the light may traverse when generated in the near vicinity of the junction 26 in the p-type region, and rays 76 and 78 are illustrative of two distinct paths in which the light may traverse when generated in the near vicinity of the junction in the n-type region. Statistically, each photon of light emerging from the surface 71 of the p-type region travels a distance through the p-type region of approximately equal to the thickness of that region. It should be understood, however. that many factors will determine the absolute efficiency of the radiant diode as presently defined, such as the relative refractive indices of the various media in which the light travels, the absolute thickness of each region in which the light travels, the reflection efficiency of the surface contact between the conductor 30 and the crystal, etc., and it will be presently shown that because of the critical contact configuration on the surface through which the light emerges from the crystal, the configuration of FIG. 3 is normally preferred to that of FIG. 4.

Under any circumstances it is desirable to reduce the thickness of the p-type region as much as possible to reduce the amount of absorption in that region. As this region is made thinner, the absolute resistance to lateral current flow becomes higher, where lateral current flow is considered to be current flowing in the diode crystal parallel to the plane of the junction or at a small angle thereto. In providing an ohmic bias connection to the surface from which the light emerges, consideration must be accorded to the premise that as much of this surface as possible must be unobstructed with overlying contacts to prevent any serious decrease of overall efficieny. It is to be noted that what will be presently referred to as de-biasing becomes an important consideration. Unless special contact configurations are employed, as described hereinafter, and if the contact area on the light surface is too small relative to the area of the surface, more bias current will flow through the area of the junction directly beneath the contact than through the other areas of the junction, provided the region between the contact and the junction is very thin. In other words, the resistance of this region to lateral current flow between the contact and that area of the junction not beneath the contact is relatively high, and this results in de-biasing of a portion of the junction which ultimately reduces the absolute efficiency of the diode. From this it can be seen that as the thickness of the p-type region in FIG. 4 is reduced, serious de-biasing effects will be prevalent if a large percentage of the area of the surface 71 is to remain unobstructed to the passage of light. On the other hand, it is not as critical that the n-type region of FIG. 3 be reduced in thickness to the extent of the p-type region because of its much lower absorption rate. Moreover, since light is to emerge only from the surface 31 in the configuration of FIG. 3, the entire surface of the p-type region 24 is provided with a suitable contact, hence precluding the possibility of de-biasing at the junction. Thus when the electrical contacts to the surfaces of the p and n-type regions are considered, it is seen that the configuration of FIG. 3 is normally preferred to that of FIG. 4.

Another form of de-biasing that can affect the efficiency of the diode is that resulting from lateral current flow in the contact itself if the bias source is connected only to a single point on the contact, wherein this current flow is defined as that which flow aways from the point of connection of the bias in a direction parallel to the surface of the diode or at a small angle thereto. However, this problem is eliminated by ensuring that the contacts are sufficiently thick and/or the specific electrical resistivity is sufficiently small so that the lateral current flow is in no way impeded. Another way of stating this is to specify that the sheet resistance of the contacts is small, whereby this term takes into consideration both the geometry and the specific electrical resistivity of the contacts.

The foregoing description is based primarily on physical observations made as to the various factors and phenomena that affect the performance of the diode. The following is presented for the purpose of explaining, at least in part, some of the phenomena, although it is expressly understood that it is theoretical and is set forth only for explanatory purposes. Because of the necessity to produce a large number of electron-hole recombinations to obtain a high efficiency, either or both of the n or p-type regions must be heavily doped to provide a high injection efficiency of the particular carrier across the junction. It is believed that n-type gallium-arsenide (doped with a donor impurity) will not absorb a light photon of energy equal to the band-gap energy, about 1.43 e.v., by the process of exciting an electron from the valence band to the conduction band, since the donor impurities cause the lower levels of the conduction band to be filled with electrons. Thus light photons of higher energy than that of the band-gap are required before absorption by this phenomenon will occur. On the other hand, it is believed that p-type gallium-arsenide (doped with an acceptor impurity) will absorb a light photon of energy equal to that of the band-gap, and probably absorbs photons of energy less than the energy of the band-gap, the amount of absorption depending to a large extent on the degree of concentration of acceptor impurity atoms. This is probably due to the states made available for the occupation by electrons between the valance and conduction bands caused by the acceptor impurity atoms. Since the 0.89 micron wavelength light generated by the diode is equivalent to about 1.4 e.v. in terms of energy, this being less than the band gap energy, it would appear that absorption could occur in the p-type material by the aforedescribed phenomena but would not occur in the n-type material.

The lifetime of the minority carriers in the region of the diode where recombinations occur to produce the light should be as low as possible to permit the diode to be operated at a very high frequency. Stated otherwise, the time required for a minority carrier to recombine with a majority carrier after the minority carrier has been injected across the junction should be very short. Since the p-type region in the preferred embodiment is to be heavily doped with acceptors to provide a high injection efficiency of holes across the junction into the n-type region, the greater percentage of recombinations will occur in the n-type material. So, the minority carriers in the n-type material are holes, and their lifetime should accordingly be very short. This can be accomplished by making the donor concentration in the n-type material relatively high.

In adjusting the donor concentration in the n-type material to provide a short lifetime for minority carriers injected therein, it should be understood that free carrier absorption of light is possible if the n-type material is too heavily doped, that is, if it is doped to a level approaching degeneracy. Thus if the density of free carriers is high enough that the semiconductor material has a conduction similar to that of a metal, absorption of light of all wavelengths will readily occur and prevent the light from escaping from the crystal. As previously stated, it is advantageous for the light to emerge from the surface of the n-type region, and therefore the donor impurity concentration in this region is adjusted to a magnitude high enough to produce a short minority carrier lifetime but not high enough to produce to any significant degree absorption of the light by free carriers. It has been found that a gallium-arsenide body having a very abrupt p-n junction is suitable if the donor impurity concentration in the n-type region is from about $5\times10^{16}$ to about $2\times10^{18}$ donor atoms/cm.$^3$, and if the acceptor impurity concentration in the p-type region is in excess of about $5\times10^{18}$ acceptor atoms/cm.$^3$. It is also desirable that the junction be very abrupt to yield a high efficiency of injection.

Figure 5:
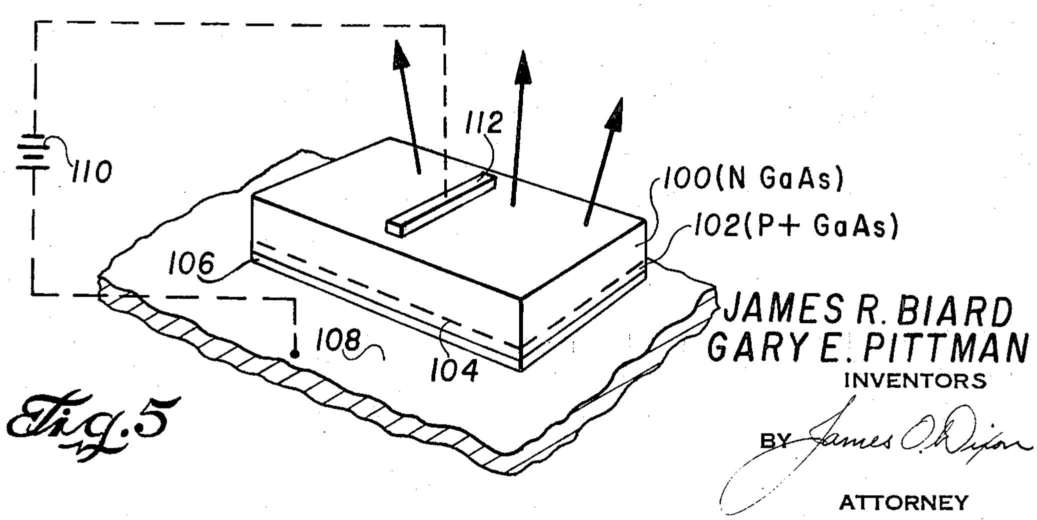
FIG. 5 is one preferred embodiment of the completed diode according to the invention.
Figure 6:
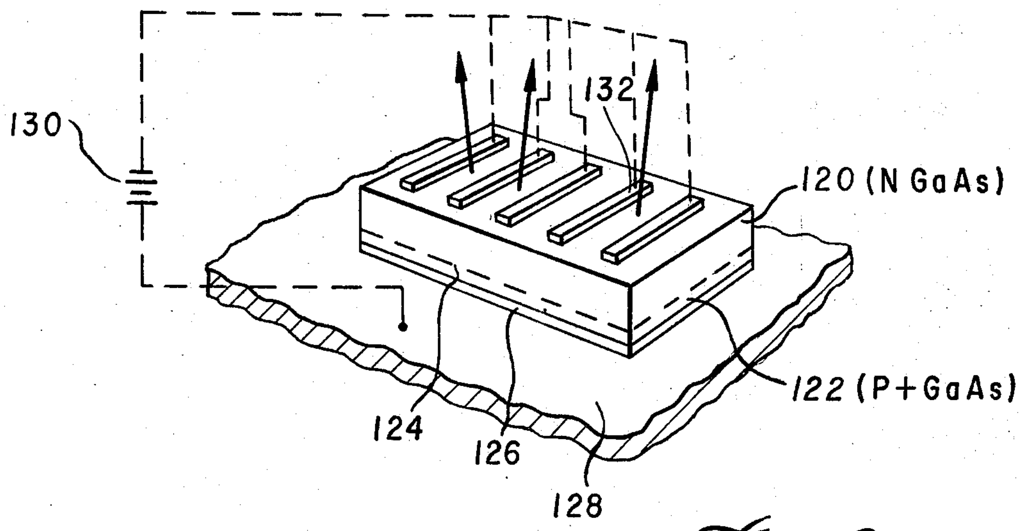
FIG. 6 is another preferred embodiment according to the invention.

Referring now to FIGS. 5 and 6 there are shown two embodiments of completed radiant diodes where the dimensions have been greatly enlarged and are out of proportion for illustrative purposes, the process of fabrication of the diodes being described hereinafter in detail. Specifically, the diode of FIG. 5 comprises a gallium-arsenide body having a relatively thick n-type conductivity region 100 forming a p-n junction, illustrated by a dashed line 104, with a relatively thin p-type conductivity region 102. The n-type region is doped with a suitable donor impurity element to a uniform concentration of from about $5\times10^{16}$ to about $2\times10^{18}$ atoms/cm.$^3$, wherein it is believed that the number of majority carriers are approximately equal to the number of donor atoms. The p-type region is doped with a suitable acceptor impurity to yield a uniform concentration in excess of about $5\times10^{18}$ atoms/cm$^3$, and the p-n junction separating the p-type and n-type regions is preferably abrupt. The wafer is soldered over the entire surface of the p-type region to a suitable metallic platform 108 by any suitable solder 106. A suitable contact 112 such as tin is alloyed to the surface of the n-type region and extends across one dimension of the surface and is symmetrically disposed with respect to the junction. This rectangular contact configuration is used for the sake of ease of fabrication and simplicity, and in addition has a sufficient area to prevent significant de-biasing of the bias current flow through any part of the junction. However, the area of the contact is small in comparison to the total area of the surface of the n-type region to which it is connected. Thus light emerging from this face is obstructed very little, if any, by the contact. Moreover, the sheet resistance of the contact is sufficiently low to preclude any significant voltage drop for current flowing laterally therethrough between the point of connection of the bias source 110 and the outer extremities of the contact 112. As an example, a suitable thickness of the n-type region is about 2.5 mils, the thickness of the p-type region is about 0.5 mil, the surface dimensions of the wafer is about 20 mils by 20 mils, and the dimensions of the contact 112 are about 20 mils in length, 3 mils wide and 2 mils thick. This gives a ratio of the area of the surface of the n-type region 100 to the area of the contact 112 of about 6.5 or greater.

The diode is operated by applying a bias source to the electrical connections 112 and 103. In this connection direct current, pulsating direct current, or alternating current can be used, and whenever a forward current bias is applied to the junction, the diode will radiate.

As another example of a diode of larger area and of greater light producing capacity, reference is had to FIG. 6 where the p-type conductivity region 122 and n-type conductivity region 120 are of approximately the same thicknesses as designated for FIG. 5. However, it is noted that because of the increased surface area of the diode, a larger area contact is required on the surface of the n-type region to prevent de-biasing of the junction, yet the total area of the contact is maintained at a minimum to prevent the obstruction of the light. About the same ratio of surface area to contact area is suitable for this purpose, and it is understood that the contact must be symmetrically disposed with respect to the junction to serve the purpose of establishing a uniform current density throughout the area of the junction. The contact 132 of FIG. 6 preferably comprises a plurality of equally spaced metallic members each being essentially the same as the contact 112 of FIG. 5, and the plurality of members is symmetrically disposed with respect to the junction 124. The diode is mounted at the surface of the p-type region on a suitable metallic member 128 by any suitable solder 126. For operation, the plurality of metallic members are commonly connected to one side of a bias source 130, and the other side of the bias source is connected to the member 128.

Referring now to a specific process of fabricating the diode, a gallium-arsenide wafer of about 1–2 $cm^2$ in area and of thickness of about 20 mils is cut from a suitable crystal having a uniform n-type conductivity throughout. The area of the wafer is large in order that several diodes can be fabricated during the following process. The crystal is normally grown from a melt such as described in the book Properties of Elemental and Compound Semiconductors, Interscience Pub., N.Y. (1960), and specifically the chapter therein by J. M. Whelan, J. O. Struthers and J. A. Ditzenberger on "Distribution Coefficients of Various Impurities in Gallium-Arsenide," p. 141. Any suitable donor impurity is used to impart n-type conductivity, such as elemental tin, tellurium, sulfur, germanium, silicon or the like. The crystal is grown to yield a wafer of donor impurity concentration of about $10^{17}$ donor atoms/cm.$^3$, and this wafer is cut where the faces lie in the 1–1–1 crystal orientation.

It should be understood that the above-stated donor and acceptor concentrations ranges include those values that render both the p-type and the n-type gallium-arsenide degenerate. However, the n-type material is not sufficiently degenerate within this range of donor concentrations to produce a tunneling effect during operation because of the fact that the barrier width is too great. In order to produce tunneling, the donor concentration would have to be increased to a value exceeding $10^{19}$ donor atoms per cubic centimeter. Since the invention is not concerned with this effect and since a concentration that would produce tunneling would greatly reduce the efficiency of the diode, such a concentration is expressly excluded from those of interest.

Considering now the two opposing 1–1–1 oriented faces of the wafer on an atomic level, it is found that the surfaces differ in that one surface would be comprised essentially of gallium atoms whereas the opposing surface is comprised essentially of arsenic atoms. As will presently become apparent it is desirable to distinguish these two surfaces and in order to do so, the wafer is etched very slightly a mixture of three parts of Conc. $H_2SO_4$, one part of 30% $H_2O_2$ and one part of deionized $H_2O$. This develops slight etch pits on what will be referred to as the gallium face and polishes what will be referred to as the arsenic face, thus visibly distinguishing the two surfaces.

The gallium surface is then sufficiently lapped with a rouge in a water slurry, preferably American Optical 309W rouge, to remove any damages on the face resulting from previous sawing of the crystal from the single-crystal grown from the melt, wherein this operation imparts a fine texture to the faces. The wafer is then ultrasonically cleaned in water, swabbed with cotton, rinsed in deionized water and dried. Then it is given about a thirty second washing in about a 48% HF bath (commercial conc. HF) just immediately prior to sealing it in a quartz ampule.

The wafer and a charge of pure zinc of about 2 mg. is placed in about a $10^3$ quartz ampule in spaced relation for diffusion of the zinc into the wafer to form a p-type conductivity region. It should be understood, however, that any suitable acceptor impurity element could be used for this operation. The zinc is preferably in the form of a foil or ribbon. The ampule is evacuated to about 10 microns of Hg pressure and sealed, and is then heated by any convenient means to about 915° C. for about 2.5 minutes, which time includes the warm-up time but accounts for very little of the total heating time. The heating operation causes the zinc to diffuse into both faces of the gallium-arsenide wafer to form a p-n junction that extends throughout the body parallel to the faces. Actually, the entire outer surface to a depth of about .4–.5 mil is converted to p-type conductivity, and under the above-stated diffusion conditions, the concentration of zinc atoms throughout the p-type region is constant and is about $5\times10^{19}$ atoms/cm.$^3$ except in very close proximity of the junction. At this point the concentration drops very rapidly with a resulting abrupt junction, as illustrated in FIG. 7. It should be especially noted here that any suitable method may be used to form a p-n junction in the crystal, and different times, temperatures, impurities, etc. may be used in order to achieve the desired results. For example, the range of acceptor impurity concentration in the p-type conductivity region acceptable for this diode is any concentration in excess of about $5\times10^{18}$ atoms/cm.$^3$. Moreover, the range of donor impurity concentration in the n-type conductivity region that is considered acceptable is from about $5\times10^{16}$ to about $2\times10^{18}$ donor atoms/cm.$^3$. These ranges are illustrated graphically in FIG. 7, and the point of intersection of the acceptor impurity concentration and the donor impurity concentration represents the p-n junction and the distance the junction is located from the face of the p-type region.

After the diffusion operation, the gallium face of the wafer is lightly lapped with any suitable rouge and subsequently thoroughly cleaned. Then an electrical contact is provided on the gallium face, which will be referred to hereinafter as the face of the p-type region. An alloy consisting of about 96% by weight of gold and 4% by weight of zinc is evaporated uniformly onto the p-type face under evacuated conditions by any suitable method, resulting in a layer of thickness of about 0.01–0.02 mil. Both faces of the wafer are then electrolytically nickel-plated to establish a nickel layer of thickness of about 0.1 mil, for example by using a sulfamate electrolytic nickel bath. The wafer is rinsed in water and subsequently heated in a vacuum furnace to about 600° C. to alloy the nickel plate to the gold-zinc layer on the p-type face, the gold-zinc layer also being bonded to the p-type face. This heating cycle consists of a fast warm-up time to 600° C. and immediately thereafter, the heat is turned off to permit the wafer to slowly cool.

The arsenic face of the wafer, now referred to as the n-type face, is lapped with an abrasive to remove the diffused p-type layer that was formed during the previous diffusion operation. The wafer is lapped on this surface until the total thickness of the wafer is considerably reduced, say to about 5 mils. The purpose of this lapping operation is to reduce the thickness of the wafer in a rough fashion to within 1 to 2 mils of its finally desired dimensions. After this is done, the thickness of the wafer is reduced to its final dimension by mounting the wafer at the p-type face on a glass platform with a suitable etch resistant bonding agent, such as apiezon wax, and immersing the assembly in a bath of etch, such as 8 parts conc. $H_2SO_4$, 1 part of 30% $H_2O_2$ and 1 part $H_2O$. This solution is suitable for etching away the gallium-arsenide body and at the same time gives a polished face on the wafer. Because the p-type region and the contact on the face thereof are protected by the apiezon wax and glass, it is not affected by the etch. The assembly is left in the etch until the total thickness of the wafer is reduced to about 2–3 mils.

At this point the wafer can be diced into several gallium-arsenide diodes by any conventional method, and the area of the individual diodes are in no way critical except as hereinafter described. Contacts to the surface of the n-type region are provided at this stage of fabrication, such as by an evaporation and alloying technique. These contacts of which particular configurations and areas have been previously described, are provided by any suitable process. For example, pure tin evaporated onto n-type gallium-arsenide and alloyed thereto suffices adequately as an ohmic connection. Lastly, the individual diodes are mounted on a suitable conducting platform at the p-type face by means of any suitable solder. For example, a transistor header is adequate as a platform. The wafer is then etched in a solution to clean the exposed p-n junction to prevent electrical shorting or leakage current thereacross. For gallium-arsenide, an electrolytic etch of 10% KOH has been found suitable for this purpose.

Although the invention has been described with reference to specific embodiments, it is expressly understood that certain modifications and substitutions can be made without departing from the scope of the invention as defined by the appended claims.

What is claimed is:

1. A semiconductor device comprising
(a) a gallium-arsenide body having a pair of opposing parallel faces,
(b) said body defining a p-type conductivity region including one of said pair of faces and a contiguous n-type conductivity region including the other of said pair of faces,
(c) said p-type and n-type regions defining a p-n junction therebetween,
(d) a first non-rectifying electrical contact connected to a major portion of said one of said pair of faces,
(e) a second non-rectifying contact connected to a minor portion of said other of said pair of faces,
(f) said second contact comprising a plurality of equally spaced, commonly connected metallic members.

2. A semiconductor device according to claim 1 wherein said p-type region contains in excess of $5\times10^{18}$ acceptor atoms per cubic centimeter and said n-type region contains between $5\times10^{16}$ and $2\times10^{18}$ donor atoms per cubic centimeter.

3. A semiconductor device according to claim 2, wherein said donor atoms are selected from the group consisting of tin, tellurium, sulfur, germanium and silicon, and said acceptor atoms are zinc.

4. A semiconductor radiant diode comprising
(a) a gallium-arsenide body having a pair of opposing parallel faces,
(b) said body defining a relatively thin p-type conductivity region including one of said pair of faces and a relatively thick, contiguous n-type conductivity region including the other of said pair of faces,
(c) said p-type and n-type regions defining therebetween a p-n junction substantially parallel to said pair of faces,
(d) a first non-rectifying electrical connection contacting substantially all of said one of said pair of faces.
(e) a second non-rectifying electrical connection contacting a minor portion of said other of said pair of faces,
(f) said second contact comprising a plurality of equally spaced, commonly connected metallic members, symmetrically disposed with respect to said junction.

5. A radiant diode comprising a body of monocrystalline GaAs, a thin P-type region adjacent the surface of a face of the body, the P-type region containing in excess of $5\times10^{18}$ acceptor atoms per cubic centimeter, the bulk of the body being of N-type material and containing between about $5\times10^{16}$ and about $2\times10^{18}$ donor atoms per cubic centimeter, a P-N junction adjacent said face and generally parallel thereto, the P-N junction underlying the P-type region, a first contact in the form of a metallic film covering a major portion of the exposed area of the P-type region on said face, the first contact lying in a plane generally parallel to said P-N junction, a second contact engaging the body and making ohmic connection to the N-type material, means for applying forward bias across said first and second contacts to provide bias current through said junction whereby radiation is generated near said P-N junction by recombination and is permitted to pass out of a surface of the body generally opposite said face with such surface being substantially unobstructed, the path of the radiation within the body being substantially entirely through the N-type GaAs.

6. A semiconductor device comprising a gallium-arsenide body having a pair of opposing parallel faces, said body defining a P-type region adjacent one of said pair of faces and a contiguous N-type region including the other of said pair of faces, said P-type and N-type regions defining a P-N junction therebetween which is closely adjacent said one of said pair of faces and generally parallel thereto, first non-rectifying electrical contact means connected to a major portion of the P-type region adjacent said one face, a second non-rectifying electrical contact means engaging a minor portion of the surface of said N-type region, means for applying a forward current bias to said contact means to provide current through said P-N junction and recombination radiation from the vicinity thereof.

7. A radiant diode comprising a body of semiconductor material, a thin P-type region defined in the body closely adjacent the surface of a face thereof, the P-type region comprising gallium arsenide and containing in excess of $5\times10^{18}$ acceptor atoms per cubic centimeter, the bulk of the body being of N-type semiconductor material and containing between about $5\times10^{16}$ and about $2\times10^{18}$ donor atoms per cubic centimeter, a P-N junction adjacent said face and generally parallel thereto, the P-N junction underlying the P-type region, a first contact in the form of a metallic film covering a major portion of the exposed area of the P-type region on said face, the first contact lying in a plane generally parallel to said P-N junction, a second contact engaging the body and making ohmic connection to the N-type material thereof, means for applying forward bias across said first and second contacts to provide bias current through said junction whereby radiation is generated near said P-N junction by recombination and is permitted to pass out of a surface of the body generally opposite said face with such surface being substantially unobstructed, the path of the radiation within the body being substantially entirely through the N-type semiconductor material.

8. A semiconductor device according to claim 6 wherein said p-type region contains in excess of $5\times10^{18}$ acceptor atoms per cubic centimeter and said n-type region contains between $5\times10^{16}$ and $2\times10^{18}$ donor atoms per cubic centimeter.

9. A semiconductor device according to claim 8, wherein said donor atoms are selected from the group consisting of tin, tellurium, sulfur, germanium and silicon, and said acceptor atoms are zinc.

References Cited by the Examiner

UNITED STATES PATENTS

| | | | |
|---|---|---|---|
| 2,924,760 | 2/1960 | Herlet | 317—235 |
| 3,059,117 | 10/1962 | Boyle et al. | 317—235 X |
| 3,102,201 | 8/1963 | Braunstein et al. | 317—235 X |

JOHN W. HUCKERT, *Primary Examiner.*

GEORGE N. WESTBY, *Examiner.*

L. ZALMAN, A. M. LESNIAK, *Assistant Examiners.*